United States Patent
Chang et al.

(10) Patent No.: US 6,590,827 B2
(45) Date of Patent: Jul. 8, 2003

(54) CLOCK DEVICE FOR SUPPORTING MULTIPLICITY OF MEMORY MODULE TYPES

(75) Inventors: Nai-Shung Chang, Taipei Hsien (TW); Jin-Cheng Huang, Taipei (TW)

(73) Assignee: Via Technologies, Inc., Taipei Hsien (TW)

( * ) Notice: Subject to any disclaimer, the term of this patent is extended or adjusted under 35 U.S.C. 154(b) by 0 days.

(21) Appl. No.: 09/955,781

(22) Filed: Sep. 19, 2001

(65) Prior Publication Data
US 2002/0060948 A1 May 23, 2002

(30) Foreign Application Priority Data

Nov. 21, 2000 (TW) ........................................ 89124635 A

(51) Int. Cl.[7] ................................................ G11C 8/00
(52) U.S. Cl. ........................... 365/233; 365/51; 365/63; 365/189.07
(58) Field of Search ........................... 365/233, 51, 52, 365/63, 230.08, 189.07, 189.05; 711/170, 105, 154

(56) References Cited

U.S. PATENT DOCUMENTS

| | | | |
|---|---|---|---|
| 6,215,727 B1 * | 4/2001 | Parson et al. | 365/233 |
| 6,347,367 B1 * | 2/2002 | Dell et al. | 711/170 |
| 6,370,053 B2 * | 4/2002 | Chang et al. | 365/51 |
| 6,377,510 B2 * | 4/2002 | Chang et al. | 365/230.06 |
| 6,424,555 B1 * | 7/2002 | Chang | 365/63 |

* cited by examiner

*Primary Examiner*—Hoai Ho
*Assistant Examiner*—Gene N. Auduong
(74) *Attorney, Agent, or Firm*—J. C. Patents

(57) ABSTRACT

A clock circuit for supporting a plurality of memory module types is provided. The clock circuit is connected to a first type memory module slot, and a second type memory module slot. The clock circuit includes a clock generator for producing a clock signal and a clock buffer having doubly defined clock pins for outputting the first type memory clock signal or the second type memory clock signal. The clock buffer receives the clock signal and outputs a first type memory clock signal to the first type memory clock pin. The doubly defined clock pin is also capable of outputting a second type memory clock signal to the second type memory clock pin. This invention is capable of using just a single clock buffer to drive a plurality of different memory module types.

21 Claims, 2 Drawing Sheets

CLOCK DEVICE FOR SUPPORTING MULTIPLICITY OF MEMORY MODULE TYPES

CROSS-REFERENCE TO RELATED APPLICATION

This application claims the priority benefit of Taiwan application serial no. 89124635, filed Nov. 21, 2000.

BACKGROUND OF THE INVENTION

1. Field of Invention

The present invention relates to a clock circuit structure for a motherboard. More particularly, the present invention relates to a clock circuit structure for the motherboard of a personal computer capable of supporting two or more memory module types.

2. Description of Related Art

In general, a personal computer system consists of a motherboard, some interface cards, and a number of peripheral devices. The motherboard is often considered as the core of a computer system. Besides a central processing unit (CPU), a chipset, and various slots for connecting a variety of interface cards, the motherboard further includes a plurality of memory module slots for connecting memory modules. Different number of memory modules may be connected into the slots depending on actual requirements of the user. Each memory module includes a plurality of memory devices assembled together into a package.

At present, the most commonly used memory modules include the synchronous dynamic random access memory (SDRAM). SDRAM operates in response to the rising edge of a system clock signal. Hence, the SDRAM only uses the rising edge to initiate subsequent data access, and control operations. Following the rapid progress in semiconductor fabricating technologies, a double data rate (DDR) SDRAM has been developed. As the name implies, the DDR dynamic random access memory (DRAM) has a data access rate twice that of the SDRAM. The DDR memory can achieve this because it is triggered at both the rising edge and the falling edge of a system clock signal. Hence, DDR DRAM is able to perform two transactions within a single clock Major differences between synchronous dynamic random access memory (SDRAM), and double data rate (DDR) DRAM includes the following: (1) SDRAM uses ordinary clock pulse signal while DDR DRAM uses a differential clock signal; (2) SDRAM uses a voltage $V_{DD}$=3.3V while DDR DRAM uses a voltage $V_{DD}$=2.5V and $V_{DDQ}$=2.5V; (3) SDRAM requires no reference voltage while DDR DRAM do need a reference voltage of ½ $V_{DDQ}$; (4) the data bus that connects with the SDRAM is generally CMOS logic while the data bus that connects with the DDR DRAM is series stub terminated logic 2 (SSTL_2); (5) SRAM data bus requires no terminated voltage ($V_{TT}$) while DDR DRAM data bus needs to have a terminated voltage ($V_{TT}$) for absorbing reflected electromagnetic wave; and (6) SDRAM bus requires no pull-up resistor while DDR DRAM bus needs a pull-up resistor.

Due to the aforementioned differences, most motherboards on the market can support either one of the memory modules. A motherboard that supports DDR DRAM modules uses a 184-pin slot design according to JEDEC specification. On the other hand, a motherboard that supports SDRAM uses a 168-pin memory module slot. This is because the signal leads of 184-pin and 168-pin slots are totally different. If a motherboard is designed to fit the layout of a 184-pin slot, considerations such as motherboard size and signal attenuation renders the fitting of a 168-pin slot on the same motherboard difficult. The same difficulties occur for fitting a 184-pin slot onto a motherboard originally designed to accommodate a 168-pin slot.

At present, due to mass production, a great number of SDRAM modules are produced, and available in the market. The stock of SDRAM modules is plentiful and the cost is cheaper. A user looking for a computer system may buy a computer system with SDRAM memory modules because of this price consideration. If price of DDR DRAM is subsequently lowered, the slower SDRAM may want to be replaced instead of having to replace the motherboard or purchase a new computer system. On the other hand, a retailer or manufacturer of motherboard may want a motherboard that supports both the 184-pin DDR DRAM as well as the 168-pin SDRAM to lower production costs, and stocking risk.

In the meantime, a clock buffer that can support both types of memories are absent from the market currently. To design a motherboard capable of supporting 184-pin DDR DRAM modules, and 168-pin SDRAM modules at the same time, two different clock buffers have to be installed. Hence, size of the motherboard will likely increase. Conversely, if a constant size needs to be maintained, layout design of the motherboard is rendered difficult. Furthermore, using two separate clock buffers is likely to produce more electromagnetic radiation than a single clock buffer.

SUMMARY OF THE INVENTION

Accordingly, one object of the present invention is to provide a clock circuit and an associated clock buffer capable of supporting a plurality of memory modules. Only a single clock buffer is used to drive the plurality of different memory modules so that difficulties in designing a motherboard layout is reduced, while a constant motherboard size is maintained, and less electromagnetic radiation is produced.

To achieve these and other advantages and in accordance with the purpose of the invention, as embodied and broadly described herein, the invention provides a clock circuit for supporting a plurality of memory module types. The clock circuit is connected to a first type memory module slot, and a second type memory module slot. The first type memory module slot has a first type memory clock pin for receiving a first type memory clock signal. The second type memory module slot has a second type memory clock pin for receiving a second type memory clock signal. The clock circuit includes a clock generator for producing a clock signal, and a clock buffer that connects to all of the aforementioned devices. The clock buffer has doubly defined clock pins capable of outputting the first type memory clock signal or the second type memory clock signal. The clock buffer receives the clock signal and outputs a first type memory clock signal to the first type memory clock pin. The doubly defined clock pin outputs a second type memory clock signal to the second type memory clock pin.

The clock circuit for supporting a plurality of memory module types further includes a control chipset connected to the clock buffer. The control chipset controls the clock buffer so that either the first type memory clock signal or the second type memory clock signal are outputted. The clock buffer further includes an inverse tri-state buffer and a tri-state buffer. The tri-state buffer has an input terminal connected to a clock signal terminal, and an output terminal connected to the doubly defined clock pin. The tri-state buffer has an input terminal connected to a clock signal terminal and an output terminal connected to the doubly defined clock pin. When the doubly defined clock pin outputs a first type memory clock signal, the inverse tri-state buffer produces an output while the output of the tri-state buffer is at a high impedance state. Conversely, when the doubly defined clock pin outputs a second type memory clock signal, the tri-state buffer produces an output while the output of the inverse tri-state buffer is at a high impedance state.

In this invention, a tri-state buffer, and an inverse tri-state buffer are produced on the same piece of silicon chip, and control of the silicon chip is selected by inputting control signals. Consequently, a clock buffer and a clock circuit for supporting different memory module types is produced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
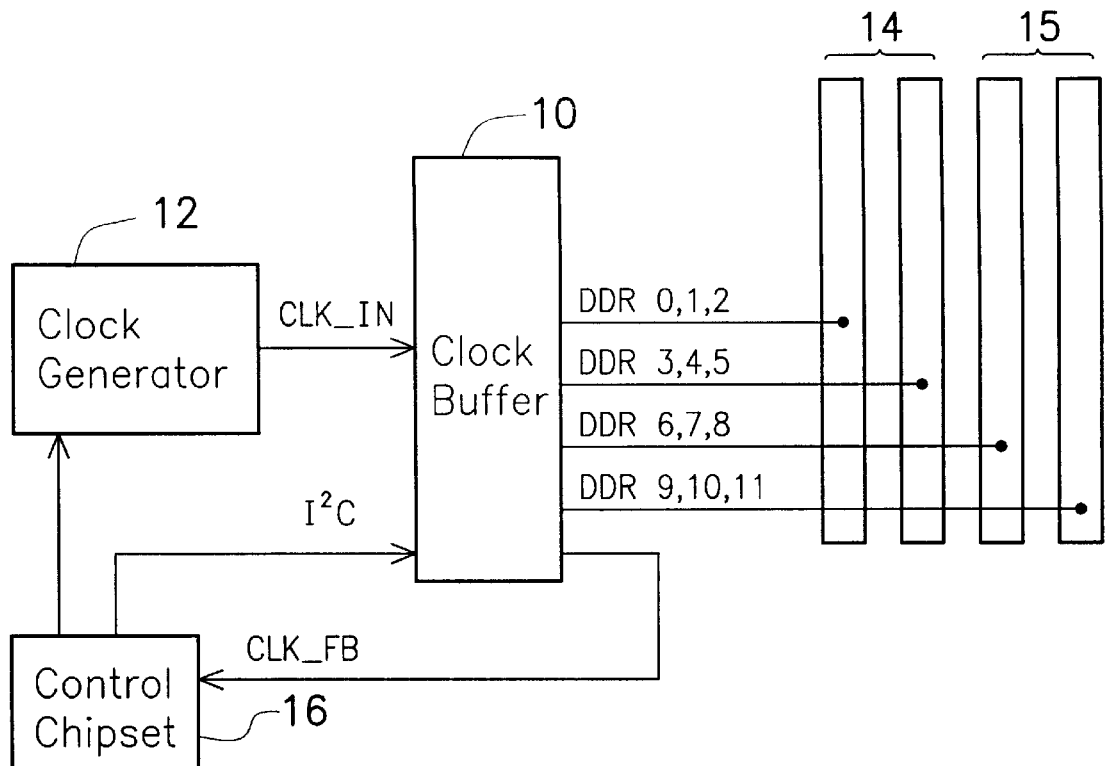
FIG. 1 is a block diagram showing a clock circuit for supporting a plurality of memory module types according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a block diagram showing a clock circuit for supporting a plurality of memory module types according to one preferred embodiment of this invention. As shown in FIG. 1, the clock circuit is connected to a first type memory module slot 14, and a second type memory module slot 15. The clock circuit includes a clock buffer 10, a clock generator 12 and a control chipset 16. The first type memory module slot 14 has a first type memory clock pin for receiving a first type memory clock signal. For example, the first type memory module slot corresponds to a JEDEC 184-pin memory module slot standard. Hence, the first type memory module slot is suitable for operating DDR DRAM modules using a differential clock signal. The second type memory module slot 15 has a second type memory clock pin for receiving a second type memory clock signal. For example, the second type memory module corresponds to a 168-pin memory module slot standard. Thus, the second type memory module slot is suitable for operating SDRAM modules using a normal clock signal.

The clock generator 12 generates a clock signal. However, because the clock generator 12 is a high frequency signal it is unable to provide a plurality of clock signal pins for a multiplicity of memory module slots due to the effect of loading. Therefore, a clock buffer 10 is required. The clock buffer 10 receives the clock signal to drive the plurality of first type memory module slots 14, and the second type memory module slots 15.

The clock buffer 10 of this invention contains doubly defined clock pins capable of outputting the first type memory clock signal or the second type memory clock signal selectively. For example, the clock buffer 10 is able to send out a differential clock signal to DDR DRAM modules for operating the DDR DRAM or a normal clock signal to SDRAM modules for operating the SDRAM. Consequently, the clock buffer 10 can output a first type memory clock signal to the first type memory clock pin by default. In addition, a selection can also be made to send a second type memory clock signal to the second type memory clock pin via the doubly defined pin.

The clock circuit further includes a control chipset 16 coupled to the clock buffer 10. The control chipset 16 directs the clock buffer 10 to issue a first type memory clock signal or a second type memory clock signal. Anyone familiar with the technologies may notice that the control chipset 16 is not essential for such selection and control. Other devices such as a jumper switch can be connected to the signal selection pin of the clock buffer 10 for control selection.

Figure 2:
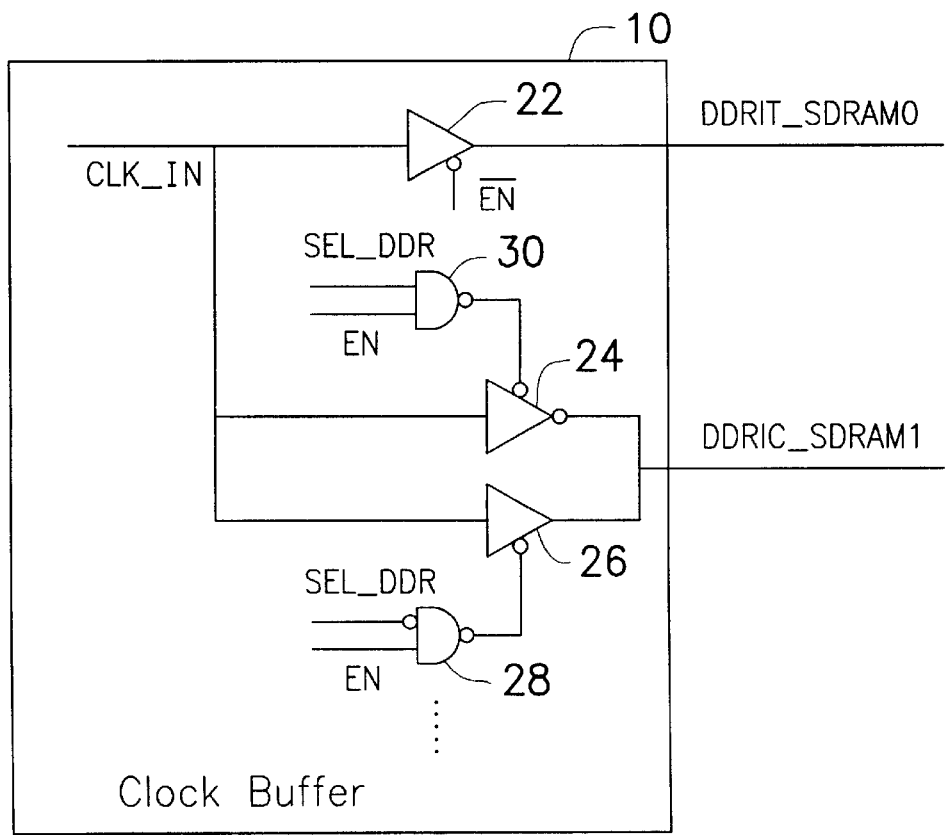
FIG. 2 is an equivalent circuit diagram showing a clock buffer according to one preferred embodiment of this invention.

FIG. 2 is an equivalent circuit diagram showing a clock buffer according to one preferred embodiment of this invention. As shown in FIG. 2, the clock buffer 10 at least includes a plurality of devices, including a tri-state buffer 22, an inverse tri-state buffer 24, and another tri-state buffer 26. An input terminal of the clock buffer 10 is connected to the clock signal (CLK_IN) terminal. A control terminal of the tri-state buffer 22 is connected to an enable signal (EN) terminal while an output terminal is connected to a doubly defined clock signal output pin (DDR1T_SDRAM0). The doubly defined clock signal output pin (DDR1T_SDRAM0) is capable of issuing a first type memory clock signal (DDR1T) or a second type memory clock signal (SDRAM1). However, both types of signals are in phase with the input clock signal (CLK_IN).

An input terminal of the inverse tri-state buffer 24 is connected to the clock signal (CLK_IN) terminal while an output terminal is connected to a doubly defined clock pin (DDR1C_SDRAM1). A control terminal of the inverse tri-state buffer 24 is connected to an output terminal of a NAND gate 30. An input terminal of the NAND gate 30 is connected to an enable signal (EN) terminal while the other input terminal is connected a select signal (SEL_DDR) terminal. An input terminal of the tri-state buffer 26 is connected to the clock signal (CLK_IN) terminal while an output terminal is connected to the doubly defined clock pin (DDR1C_SDRAM1). A control terminal of the tri-state buffer 26 is connected to an output terminal of another NAND gate 28. Similarly, an input terminal of the NAND gate 28 is connected to an enable signal (EN) terminal while the other input terminal is connected a select signal (SEL_DDR) terminal. However, the NAND gate 28 is different from the NAND gate 30. The input terminal of the NAND gate 28 must receive a low select signal SEL DDR signal to activate the NAND gate 28, in other words, outputs a low potential.

When the doubly defined clock pin (DDR1C_SDRAM1) outputs a first type memory clock signal DDR1C, the output terminal of the inverse tri-state buffer 24 is enabled. Moreover, the output signal has an inverse phase relationship with the clock signal (CLK_IN) while the output terminal of the tri-state buffer 24 is in a high impedance state. On the other hand, when the doubly defined clock pin (DDR1C_SDRAM1) outputs a second type memory clock signal SDRAM1, the output terminal of the tri-state buffer 26 is enabled. The output terminal of the inverse tri-state buffer 24 is in a high impedance state. In other words, the doubly defined clock pin that includes the DDR1T_SDRAM0 and DDR1C_SDRAM1 outputs a set of different clock signal if the first type memory clock signal is chosen. Conversely, two identical phase signals are produced if the second type memory clock signal is chosen.

Figure 3A:
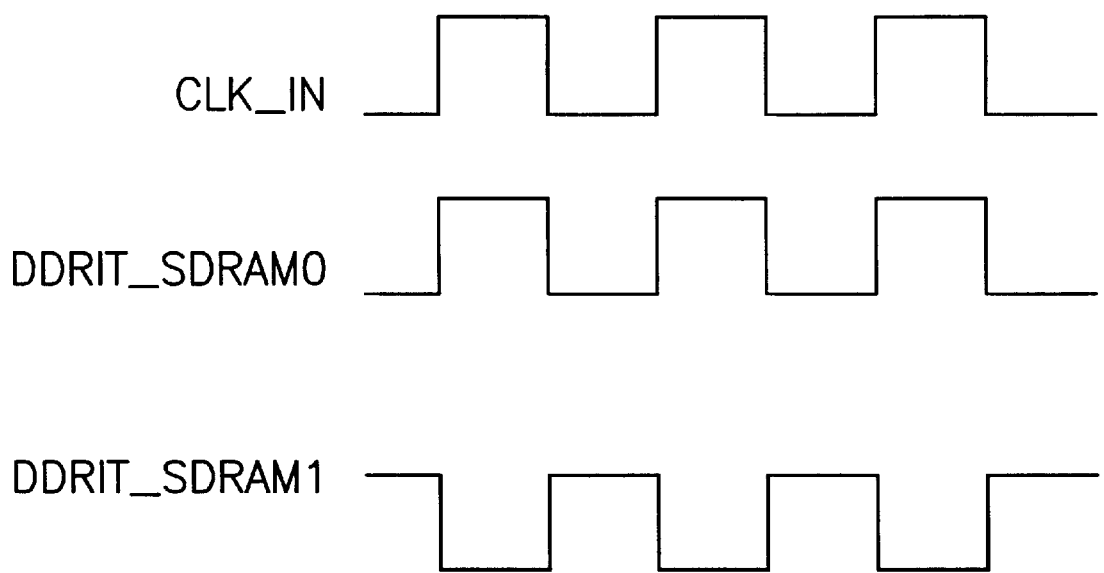
FIG. 3A is a timing diagram showing a portion of the signal when SEL_DDR=1 in FIG. 2.
Figure 3B:
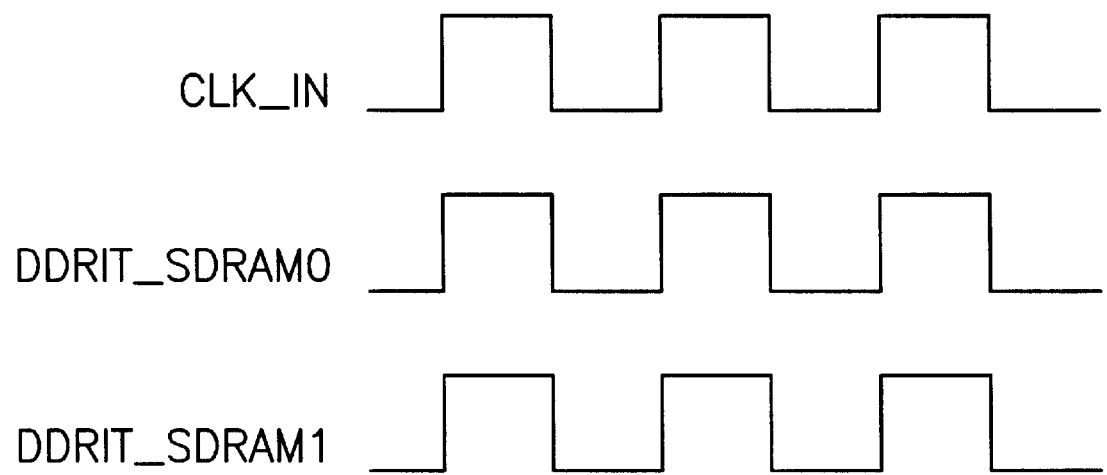
FIG. 3B is a timing diagram showing a portion of the signal when SEL_DDR=0 in FIG. 2.

FIG. 3A is a timing diagram showing a portion of the signal when SEL_DDR=1 in FIG. 2. FIG. 3B is a timing diagram showing a portion of the signal when SEL_DDR=0 in FIG. 2. As shown in FIGS. 3A and 3B, when SEL_DDR=1, signals on the DDR1T_SDRAM0 and DDRLC_SDRAM1 are 180° out of phase with each other. On the contrary, when SEL_DDR=0, signals on the DDR1T_SDRAM0 and DDR1C_SDRAM1 are in phase.

In conclusion, this invention provides a tri-state buffer, and an inverse tri-state buffer on the same silicon chip. Control of the silicon chip is achieved by input control signals. Consequently, a clock buffer and a clock circuit for supporting different memory module types are produced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A clock circuit for supporting a plurality of memory module types, wherein said clock circuit connects with a first type memory module slot and a second type memory module slot, wherein said first memory module slot has a first type memory clock pin for receiving a first type memory clock signal, wherein said second memory module slot has a second type memory clock pin for receiving a second type memory clock signal, comprising:
   a clock generator for producing a clock signal; and
   a clock buffer coupled to said first type memory module slot, said second memory module slot and said clock generator, wherein said clock buffer has a doubly defined clock pin for outputting either said first type memory clock signal or said second type memory clock signal, and said clock buffer also receives said clock signal and outputs a first type memory clock signal to said first type memory clock pin or outputs a second type memory clock signal to said second type memory clock pin.

2. The clock circuit of claim 1, wherein said circuit further includes a control chipset coupled to said clock buffer for controlling said clock buffer such that either a first type memory clock signal or a second type memory clock signal is outputted from said clock buffer.

3. The clock circuit of claim 1, wherein said first type memory module slot corresponds to a JEDEC 184-pin memory module standard.

4. The clock circuit of claim 1, wherein said second type memory module slot corresponds to a 168-pin memory module standard.

5. The clock circuit of claim 1, wherein said clock buffer further includes:

an inverse tri-state buffer having an input terminal connected to said clock signal terminal and an output terminal connected to said doubly defined clock pin; and a tri-state buffer having an input terminal connected to said clock signal and an output terminal connected to said doubly defined clock pin, wherein said inverse tri-state buffer is activated and said output terminal of said tri-state buffer is in a high impedance state when said doubly defined clock pin outputs a first type memory clock signal, wherein said tri-state buffer is activated and said inverse tri-state buffer is in a high impedance state when said double defined clock pin outputs a second type memory clock signal.

6. The clock circuit of claim 1, wherein said first type memory module includes a double data rate dynamic random access memory module.

7. The clock circuit of claim 1, wherein said second type memory module includes a synchronous dynamic random access memory module.

8. The clock circuit of claim 1, wherein the first type clock signal and the second type clock signal comprises an ordinary clock signal and a differential clock signal.

9. A clock buffer for a circuit system, wherein said circuit system includes a first type memory module slot having a first type memory clock pin for receiving a first type memory clock signal and a second type memory module slot having a second type memory clock pin for receiving a second type memory clock signal, comprising:

a doubly defined clock pin for outputting either said first type memory clock signal or said second type memory clock signal, wherein said clock buffer receives a clock signal and outputs said first type memory clock signal to said first type memory clock pin or outputs said second type memory clock signal to said second type memory clock pin.

10. The clock buffer of claim 9, wherein said first type memory module slot corresponds to a JEDEC 184-pin memory module standard.

11. The clock buffer of claim 9, wherein said second type memory module slot corresponds to a 168-pin memory module standard.

12. The clock buffer of claim 9, wherein said clock buffer further includes:

an inverse tri-state buffer having an input terminal connected to said clock signal terminal and an output terminal connected to said doubly defined clock pin; and a tri-state buffer having an input terminal connected to said clock signal and an output terminal connected to said doubly defined clock pin, wherein said inverse tri-state buffer is activated and said output terminal of said tri-state buffer is in a high impedance state when said doubly defined clock pin outputs a first type memory clock signal, wherein said tri-state buffer is activated and said inverse tri-state buffer is in a high impedance state when said double defined clock pin outputs a second type memory clock signal.

13. The clock buffer of claim 9, wherein said circuit system further includes a clock generator for producing a clock signal.

14. The clock buffer of claim 9, wherein said first type memory module includes a double data rate dynamic random access memory module.

15. The clock buffer of claim 9, wherein said second type memory module includes a synchronous dynamic random access memory module.

16. The clock buffer of claim 9, wherein said circuit system further includes a control chipset coupled to said clock buffer for controlling said clock buffer such that either a first type memory clock signal or a second type memory clock signal is output.

17. The clock circuit of claim 9, wherein the first type clock signal and the second type clock signal comprises an ordinary clock signal and a differential clock signal.

18. A clock buffer for a circuit system, wherein said circuit system includes a first type memory module slot having a first type memory clock pin for receiving a first type memory clock signal and a second type memory module slot having a second type memory clock pin for receiving a second type memory clock signal, comprising:

a doubly defined clock pin for outputting either said first type memory clock signal or said second type memory clock signal, wherein said clock buffer receives a clock signal and outputs said first type memory clock signal to said first type memory clock pin or outputs said second type memory clock signal to said second type memory clock pin, wherein said clock buffer further includes:
      an inverse tri-state buffer having an input terminal connected to said clock signal terminal and an output terminal connected to said doubly defined clock pin; and
      a tri-state buffer having an input terminal connected to said clock signal and an output terminal connected to said doubly defined clock pin, wherein said inverse tri-state buffer is activated and said output terminal of said tri-state buffer is in a high impedance state when said doubly defined clock pin outputs a first type memory clock signal, wherein said tri-state buffer is activated and said inverse tri-state buffer is in a high impedance state when said double defined clock pin outputs a second type memory clock signal.

19. The clock circuit of claim 18, wherein the first type clock signal and the second type clock signal comprises an ordinary dock signal and a differential clock signal.

20. A clock circuit for supporting a plurality of memory module types, wherein said clock circuit connects with a first type memory module slot and a second type memory module slot, wherein said first memory module slot has a first type memory clock pin for receiving a first type memory clock signal, wherein said second memory module slot has a second type memory clock pin for receiving a second type memory clock signal, comprising:

a clock generator for producing a clock signal; and
   a clock buffer coupled to said first type memory module slot, said second memory module slot and said clock generator, wherein said clock buffer has a doubly defined clock pin for outputting either said first type memory clock signal or said second type memory clock signal, and said clock buffer also receives said clock signal and outputs a first type memory clock signal to said first type memory clock pin or outputs a second type memory clock signal to said second type memory clock pin, wherein said clock buffer further includes:
      an inverse tri-state buffer having an input terminal connected to said clock signal terminal and an output terminal connected to said doubly defined clock pin; and
      a tri-state buffer having an input terminal connected to said clock signal and an output terminal connected to said doubly defined clock pin, wherein said inverse tri-state buffer is activated and said output terminal of said tri-state buffer is in a high impedance state when said doubly defined clock pin outputs a first type memory clock signal, wherein said tri-state buffer is activated and said inverse tri-state buffer is in a high impedance state when said double defined clock pin outputs a second type memory clock signal.

21. The clock circuit of claim 20, wherein the first type clock signal and the second type clock signal comprises an ordinary clock signal and a differential clock signal.

\* \* \* \* \*